United States Patent [19]

Hollyday

[11] 3,961,294

[45] June 1, 1976

[54] CONNECTOR HAVING FILTER ADAPTOR

[75] Inventor: Robert David Hollyday, Hershey, Pa.

[73] Assignee: AMP Incorporated, Harrisburg, Pa.

[22] Filed: Apr. 21, 1975

[21] Appl. No.: 569,919

[52] U.S. Cl. .............................. 333/79; 339/143 R; 339/147 R

[51] Int. Cl.$^2$ ...................... H03H 7/04; H03H 7/14; H01R 25/08; H01R 3/06

[58] Field of Search .............. 339/9 R, 14 R, 143 R, 339/147 R, 275 R, 275 C, 275 T, 252 R, 252 P, 252 S, 207 R, 207 S, 254 M; 333/79

[56] References Cited

UNITED STATES PATENTS

| | | | |
|---|---|---|---|
| 3,535,676 | 10/1970 | Schultz, Sr. | 339/143 |
| 3,825,874 | 7/1974 | Peverill | 339/147 R |
| 3,854,107 | 12/1974 | Tuchto et al. | 333/79 |

*Primary Examiner*—Alfred E. Smith
*Assistant Examiner*—Marvin Nussbaum
*Attorney, Agent, or Firm*—Gerald K. Kita

[57] ABSTRACT

A technique for adapting an existing connector of the type having conductive pins or sockets therein to accommodate sleeve form electrical filters. A conducting shell within which filters and pins or sockets are secured is adapted for mounting to an existing connector. Any combination of one circuit to a full compliment of circuits within the connector configuration can be filtered. Those circuits not filtered will have pins or sockets which are conductive. The filtered pins or sockets are secured within the connector through the conducting shell assembly, whereas the nonfiltered pins or sockets are secured within the connector itself. The rear portion of the connector assembly is filled with an insulating material to protect the filters and hold the rear extension of the pins or sockets to the basic connector configuration.

4 Claims, 4 Drawing Figures

CONNECTOR HAVING FILTER ADAPTOR

BACKGROUND OF THE INVENTION

Electrical connectors provide a means for coupling electrical circuits at selected locations. The connectors are in the form of separate connector portions which are mated for coupling together. One connector portion contains a cluster of discrete elongated pins to which individual circuits are terminated. The other connector portion contains a cluster of discrete conducting receptacles which are terminated to additional circuits. When the connector portions are mated the pins are pluggably received in corresponding receptacles to complete electrical circuits through the connector portions. The mating connector portions are of fixed design to enable standardization whereas the cluster arrangement of the pins and receptacles may be varied to adapt the standardized connectors for use in a variety of circuit configurations. It has now been found desirable to provide filtering of selected circuits for example to isolate these circuits from undesired EMI/RFI interferences or to provide a pass band frequency for a circuit. Incorporating the necessary filter structure within the standardized connector has been a problem due to limitations in size, available space and packaging techniques.

BRIEF DESCRIPTION OF THE PRESENT INVENTION

The present invention relates to packaging filtered connector contacts within a standardized connector and more particularly to adapting a standardized connector for the use of filtered pins or sockets. The invention briefly comprises a conductive shell to which the filters of a filtered pin or socket are electrically grounded and within which the nonfiltered pins or sockets are rigidly mounted and electrically isolated from the conductive shell. The conductive shell is secured in tandem relationship with one of the connector portions without interfering with matability of the connector portion with its corresponding other connector portion. The nonfiltered pins or sockets are locked within the connector portion of the assembly. Further protection to the filter sleeves and stability and alignment of the portion of the pins or sockets extending beyond the conducting shell is accomplished by insulating the rear portion of the connector assembly.

OBJECT

It is accordingly an object of the present invention to provide a structure and method for adapting a standard connector with filtered connector pins or sockets.

Another object of the present invention is to provide a cluster of connector pins or sockets of which any combination of the connector circuit configuration may be filtered and the remainder of the circuits are nonfiltered.

Another object of the present invention is to provide a conductive shell in which are mounted a cluster of pins or sockets of which any combination of the connector circuit configuration may be filtered, with the conductive shell being mounted to a standard connector portion and with the nonfiltered pins latchably secured to the connector portion leaving the filtered pins within the connector housing but not secured therewithin.

Other objects and advantages of the present invention will become apparent from the following detailed description taken in conjunction with the accompanying drawings.

DETAILED DESCRIPTION OF THE PREFERRED EMBODIMENT

Figure 1:
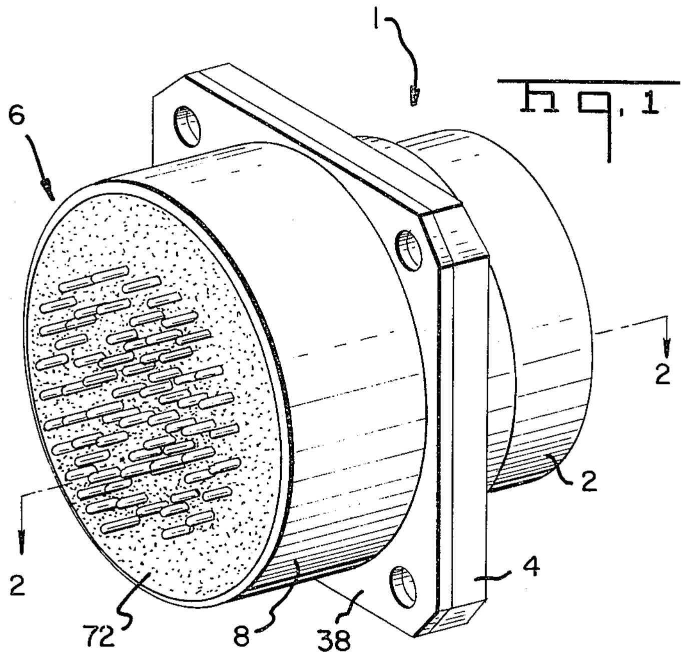
FIG. 1 is an enlarged perspective of a connector portion adapted with a conductive shell for filtered and unfiltered connector pins.
Figure 2:
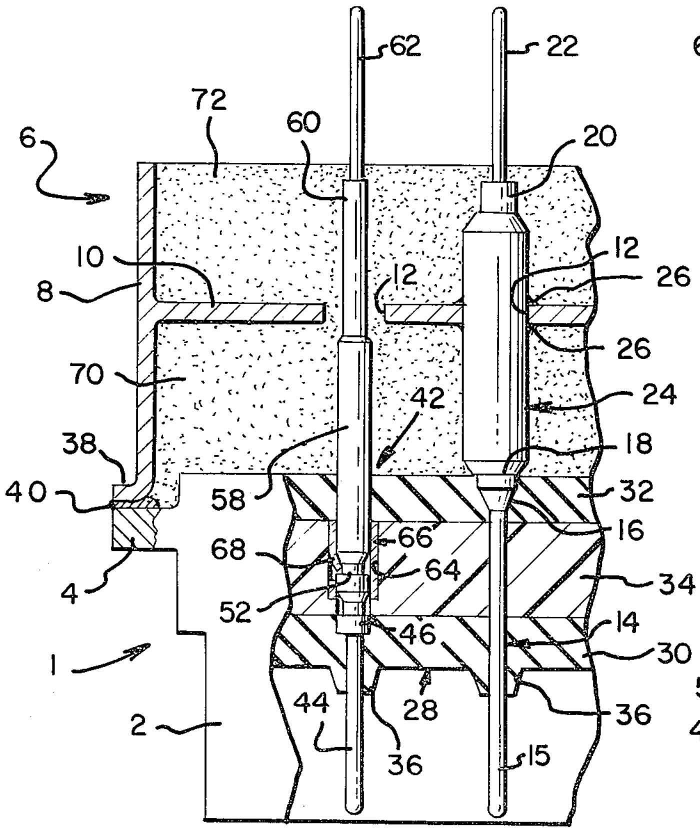
FIG. 2 is an enlarged fragmentary section taken along the line 2—2 of FIG. 1.
Figure 4:
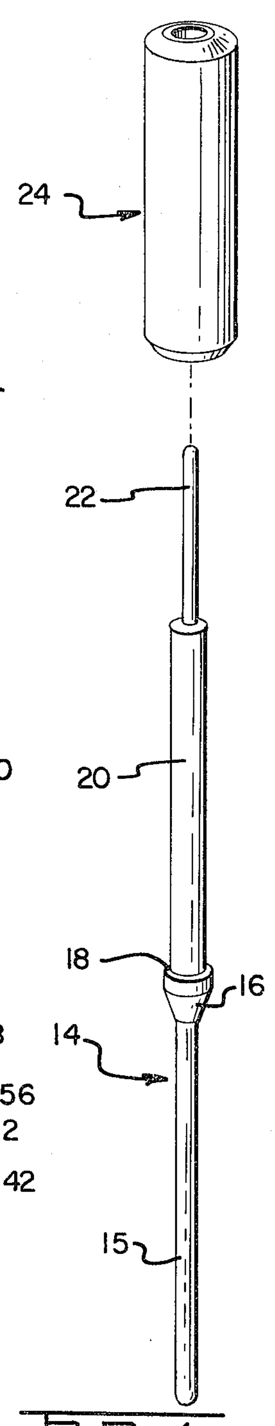
FIG. 4 is an enlarged perspective of a filtered pin according to the present invention.

With more particular reference to the drawings there is shown generally at 1 in FIG. 1 a standardized connector portion having a circular body or housing portion provided with an encircling projecting flange adjacent one end thereof. It is to be understood that the housing portion 1 is of standardized design and is adapted for electrical connection to a mating housing portion (not shown). It is also to be understood that what is illustrated and described is a flanged connector portion, although any other type of connector may comprise the environment for the present invention to be described in detail. As shown in FIGS. 1 and 2 the present invention comprises a conductive shell generally illustrated at 6 in the form of an outer housing portion 8, here in the form of a cylinder. The housing portion 8 may also be of any other form as desired. The shell 8 includes a central web 10 of conductive material which may be formed integral with the shell 8. The web 10 is provided therethrough with a plurality of discrete apertures 12 corresponding to conductive pin locations that are normally associated with the standardized housing 1. More particularly, there is in FIG. 4 a conductive pin generally shown at 14 of a type normally received within the cluster of conductive pins normally associated with the standardized housing portion 1. The conductive pin 14 includes a frusto-conical portion 16 adjacent a stepped shoulder 18 thereon. Adjacent the shoulder 18 is an elongated cylindrical portion 20 which terminates in reduced diameter elongated rounded tip pin portion 22. The pin 14 is generally longer than that normally associated for connection or receipt within the standardized connector housing portion 1, in that the cylindrical portion 20 thereof has been added such that a filter generally of cylindrical sleeve form 24 may be received thereover. As shown in FIG. 2 one end of the sleeve 24 is seated against the shoulder 18 and the other end of the sleeve 24 partially encircles the cylindrical portion 20. The cylindrical filter 24 is described in U.S. Pat. No. 3,743,978 and is soldered or otherwise electrically coupled directly to the pin portion 20. Selected pins 14 with corresponding filters 24 electrically connected in encirclement thereover are assembled within selected apertures 12 of the web 10. The outer periphery of the cylindrical filters 24 are electrically coupled such as for example by solder at 26 to the web 10 providing a subassembly of the conductive shell 8 having filtered pins assembled thereto. As is well known in soldering practices the solder 26 forms encircling rings on the web and around the cylindrical periphery of the filters 24 forming what is commonly known as solder fillets.

As shown in FIG. 2 the subassembly is positioned in tandem relationship with the connector portion 1 such that the elongated end portions 15 of the filtered conductive pins 14 are plugably received within the confines of the connector housing portion 2. More particularly as shown in FIG. 2 the housing portion 2 is provided therein with a relatively thick seal 28 comprised of three layers, an outer layer 30 and a layer 32 of resilient compressible sealant material such as silicone rubber and a central layer 34 of relatively noncompressible hard insulating material 34. The three layers of the seal 28 are apertured so as to receive the filtered pin in the manner shown. Specifically the layer 32 resiliently and compressibly encircles the portion 16 of the pin and the layer 30 resiliently and compressibly encircles the portion 15 of the pin 14. The layer 30 also is provided with a molded projecting lip or flange 36 which also compressibly and resiliently encircles the pin portion 15. The seal 28 therefore serves as a moisture resistant seal in encirclement about the pins 14. It is further to be noted that the conductive shell 8 includes a flange portion 38 which matches the outline of the flange portion 4. The flange portions 38 and 4 are joined togehter where they abut each other with an adhesive material 40 which is advantageously of conducting material, when the housing portion 1 is of conductive material, such that the housing portion 1 and the shell 8 are electrically grounded to each other. Also it is to be noted that the outer periphery of the filter or filters 24 are also electrically grounded to the web 10 of the shell 8 by virtue of the solder connections 26.

Figure 3:
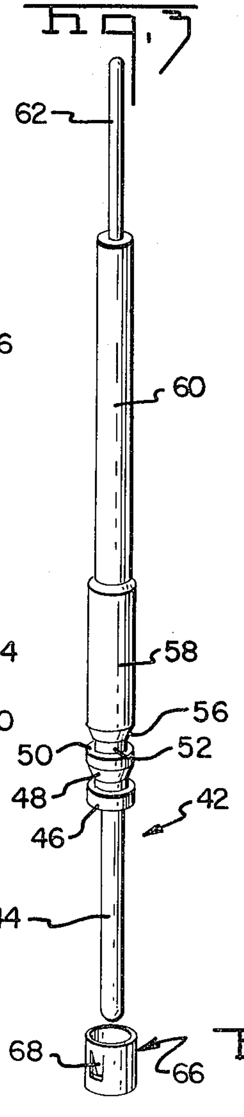
FIG. 3 is an enlarged perspective of a nonfiltered pin according to the present invention.

As shown in FIGS. 2 and 3, a second conductive pin is shown generally at 42 and comprises an elongated end portion 44 similar to the elongated pin portion 15. The pin 42 is provided thereon with a projecting collar portion 46 immediately adjacent to a frusto-conical portion 48 having a shoulder portion 50 immediately adjacent to a grooved portion 52 of reduced diameter which is in turn adjacent a frusto-conical tapered portion 56. Adjacent to the frusto-conical tapered portion 56 is an enlarged diameter portion 58 which is stepped down to a reduced diameter portion 60 which is again stepped down to a reduced diameter elongated pin portion 62. With the shell 8 and filtered pin 14 in position on the connector portion 1 the additional pin 42 is inserted freely through an additional aperture 12 of the web 10 with the pin portion 44 being received within the confines of the housing portion 2 of the connector portion 1. As shown the layer 30 of the seal 28 is recessed to receive the collar 46 in seated engagement therein. The layer 34 is provided with a stepped diameter recess 64 within which is seated a cylindrical sleeve 66 of conducting material such as metal in the form of a cylindrical sleeve having an inwardly projecting tang 68 which is struck out from the cylindrical sidewall of the sleeve 66. The sleeve 66 is assembled within the seal 28 prior to assembly of the seal 28 within the confines of the connector 2. When the additional unfiltered pin 42 is received in the seal 28 the tang 68 will register within the groove 52 latchingly retaining the unfiltered pin 42 to the connector portion 1. It is shown in FIG. 2 that an additional lip or projecting flange 36 resiliently and compressibly encircles the pin portion 44 to provide a moisture resistant seal. In addition the layer 30 compressibly encircles pin portions 44 and 46 to provide an additional safeguard against the ingress of moisture. In FIG. 2 it is to be noted that the reduced diameter portion 60 of the additional unfiltered pin 42 is in substantially spaced relationship from the web portion 10. The clearance between the aperture 12 and the pin portion 60 permit the passage therein of a hypodermic needle, for example, which is utilized to inject an encapsulant material 70 which completely fills the confines of the shell 8 between the connector portion 1 and the web 10. The encapsulant material also fills the clearance between the aperture 12 and pin portion 60 electrically isolating and spacing the pin portion 60 from the web 10. Encapsulant accordingly secures the filtered pin 14 and the unfiltered pin 42 within the conductive shell 8. The remaining portion of the conductive shell above the web portion 10 as shown in FIG. 2 may also be filled with encapsulant material 72 which may be the same encapsulant material as 70. As shown only a single filtered pin 14 and one unfiltered pin 42 has been illustrated and described. It is to be noted however that additional pins both filtered and unfiltered may be utilized without departing from the spirit and scope of the present invention. A particular feature of the present invention is that the encapsulant 70 secures the filtered and unfiltered pins within the shell 8 whereas the unfiltered pin 42 is latchingly secured within the sleeve 66 and accordingly is latchably secured to the connector. The encapsulant is seen in FIG. 2 to completely surround each filter 24 and contact tightly in encirclement around the pin portion 22 of each filtered contact 14. This seals each filter from adverse environments and also rigidizes each filter 24 and its corresponding contact 14, insuring that forces on the contact 14 and filter 24 are distributed substantially along their lengths and insuring maximum support of the filter 24 by and also within the shell 6. The filtered pin is freely received in the confines of the connector portion 1 and is merely encircled by the seal 28.

It is noted that the portions 44 and 15 of the pins comprise male contacts or terminals. Any other type of contacts or terminals of the prior art may be substituted for the portions 44 and 15; particularly female contacts or terminals in the form of receptacles or spring contact type contacts or terminals.

The present invention therefore has described a method and structure for adapting a fixed design connector to accepting filtered pins. Other modifications and embodiments of the present invention are intended to be covered by the spirit and scope of the appended claims.

What is claimed is:

1. A connector, comprising:

a conducting shell having an interior web provided with apertures therethrough, first and second conductive pins freely received through said apertures, an electrical filter of sleeve configuration soldered over at least one first pin, the outer periphery of each said filter being soldered within a corresponding aperture of said web, a connector housing secured to said shell, a seal of resilient material in the interior of said connector compressibly encircling said first and second pins, said connector housing being provided with latching means latchably securing at least one second pin within said connector housing, and encapsulant material in said shell encircling said first and second pins and separating each said second pin from said web.

2. The structure as recited in claim 1, wherein said connector housing is conductive and secured to said shell by a conductive adhesive.

3. The structure as recited in claim 1, wherein said latching means comprises a sleeve provided with a tang latchably engaging a corresponding second pin.

4. A method of manufacturing a connector, comprising the steps of:

providing conductive first pins thereover with encircling filters of sleeve configuration, electrically coupling said filters in selected apertures of a conducting web portion of a conducting shell, receiving said first pins in a connector housing, sealably encircling said first pins with a seal of said connector housing, securing said shell to said connector housing, inserting additional conducting pins freely through additional apertures of said web, latchably connecting said additional pins in said connector housing, sealably encircling said additional pins with said seal, and encapsulating said first pins and said additional pins in said shell to maintain said additional pins in spaced relationship from said web.

* * * * *